(12) United States Patent
Cole et al.

(10) Patent No.: US 6,870,378 B1
(45) Date of Patent: Mar. 22, 2005

(54) TEST APPARATUS AND METHOD FOR RELIABILITY ASSESSMENT OF HIGH POWER SWITCHING DEVICES

(75) Inventors: Melanie W. Cole, Churchville, MD (US); Gary L. Katulka, Forrest Hill, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/146,117

(22) Filed: May 16, 2002

(51) Int. Cl.[7] .......................................... G01R 31/302
(52) U.S. Cl. ..................................... 324/750; 324/752
(58) Field of Search ................................ 324/750–753, 324/760, 765, 501; 438/14, 17, 18; 250/227.3

(56) References Cited

U.S. PATENT DOCUMENTS

| | | | | | |
|---|---|---|---|---|---|
| 5,414,370 | A | * | 5/1995 | Hashinaga et al. | 324/760 |
| 5,422,498 | A | * | 6/1995 | Nikawa et al. | 257/48 |
| 5,952,837 | A | * | 9/1999 | Koyama | 324/752 |
| 6,677,760 | B1 | * | 1/2004 | Koyama | 324/501 |

* cited by examiner

*Primary Examiner*—Vinh P. Nguyen
(74) *Attorney, Agent, or Firm*—William Randolph

(57) ABSTRACT

A test apparatus and method is provided for dynamic thermal and electrical fatigue testing of a semiconductor in an operating environment, such as air, that mimic thermal and electrical stress in the semiconductor during high power switching in the operating environment. Comparisons of pre- and post-testing electrical measurements, i.e., current, voltage and contact resistance, are combined to provide an indicator or long-term reliability.

6 Claims, 5 Drawing Sheets

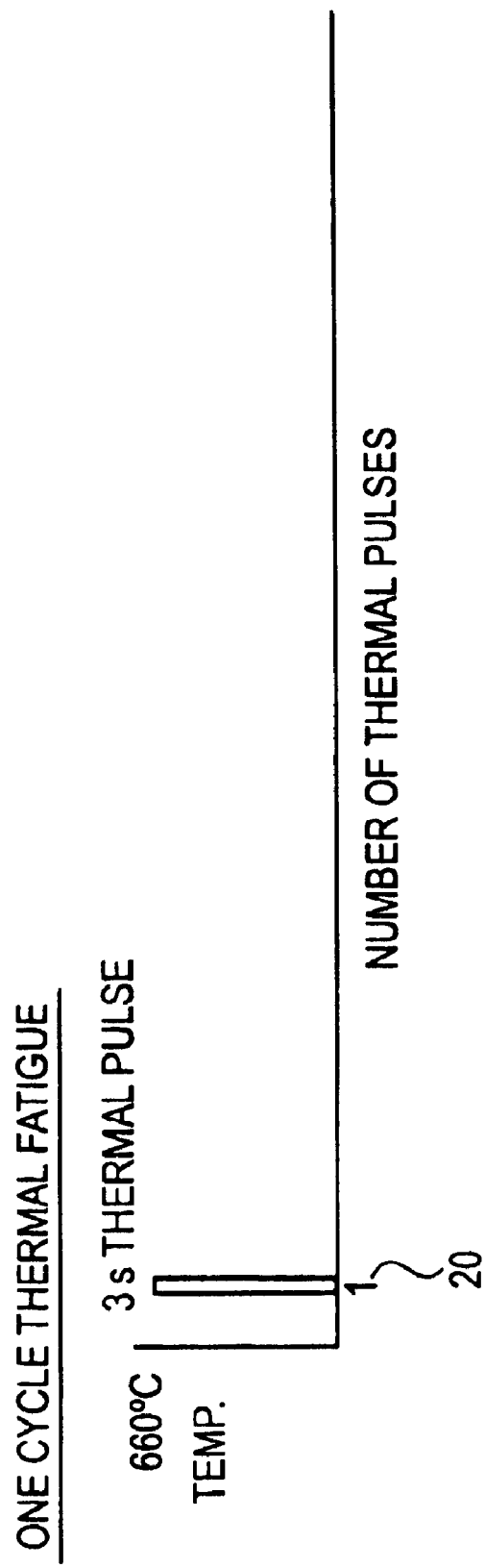

TEST APPARATUS AND METHOD FOR RELIABILITY ASSESSMENT OF HIGH POWER SWITCHING DEVICES

BACKGROUND OF THE INVENTION

1. Field of the Invention

This invention relates to an apparatus and method for combined thermal and electrical fatigue testing in an operating environment of the reliability of electrical devices. More particularly, this invention provides an apparatus and method that each mimics thermal and electrical stress in a semiconductor during high power switching in an operating environment, such as air. Most particularly, this invention provides and apparatus and method for assessing long term reliability of electronic devices through dynamic testing in an operating environment of semiconductors for voids and short circuits.

2. Discussion of the Related Art

In order to promote, design and realize reliable SiC power devices it is necessary to assess the performance of device components under the influence of their potential operational stress regimes. This is particularly critical for pulsed power device applications, namely, palpitated high power switching, in which the operational environment is dominated by acute cyclic pulsed power actions. The pulsed power action ultimately translates into severe thermal, electrical, and mechanical cyclic stresses in the device materials.

Prior art approaches to assessing the thermal stability for SiC high power devices at high temperatures employ static thermal testing. A usual testing procedure for SiC consists of inducing thermal fatigue by exposing a test structure to a temperature in the range of 300 to 500° C. for more than 100 hours. A typical vacuum furnace, as well known in the art, is employed for such testing. Pre- and post-testing electrical measurements, i.e., current-voltage and specific contact resistance, are compared to obtain an indicator of long-term device reliability. Prior art approaches to assessing pulsed-power thermal stability have consisted of inducing thermal fatigue by exposing the contact-SiC structure to high temperatures (in the range of 900–100° C.) for several minutes in a vacuum environment. A rapid thermal annealer (RTA) is the typical instrument employed for such testing. After exposure, electrical measurements, i.e., current-voltage, and specific contact resistance, are taken and compared to pre-thermally fatigued electrical measurements.

In order to reliably utilize SiC for pulsed power switching applications it is necessary to determine the effects of such cyclic stress regimes on the fundamental pulsed power device components. Another aspect of SiC reliability derives from the high current densities associated with SiC power devices that can cause failure due to electromigration. Electromigration refers to the transport of mass in metals under the influence of current. Electromigration occurs by the transfer of momentum from the electrons to the positive metal ions. When a high current passes through thin metal conductors (metal conductors/interconnects and contacts) metal ions in some regions may pile up whereas voids will form in other regions with resulting respective short-circuits of adjacent conductors and open circuits. Ultimately, electromigration limits device performance and reduces reliability in the long-term.

Prior art test approaches employed for detecting and measuring electromigration are similar to those prior art approaches for static thermal testing. That is, the contact-SiC structure is exposed to high fields in a vacuum for a static non-pulsed duration. Thermal vacuum furnaces do not provide results with respect to thermal stability and electromigration survivability that apply to survivability in air. In other words, a vacuum ambient is not representative of the typical environmental condition these devices typically operate in.

In addition to this shortcoming of prior art static thermal testing, this prior art testing has been directed to measuring individual effects and has not been directed to a combined effects test approach.

SUMMARY OF THE INVENTION

Thus, there is a need for a power device reliability test apparatus and method for the evaluation of non-static combined effects testing, i.e., combined thermal and electrical effects, in a device-compatible environment, such as air, or other ambient, i.e., nitrogen etc.

The present invention provides a combined effects "thermal and electrical" test apparatus and method which serves to determine the window of reliability for individual SiC device components, namely ohmic contact structures, or complete device structures. Using the apparatus and method of the present invention, unreliable ohmic contacts can be detected in the devices that cause degradation in device properties. It is this degradation that ultimately leads to system when unreliable ohmic contacts are present.

By performing both pre- and post-testing materials and electrical analyses and comparing results, the apparatus and method of the present invention enable assessment of the degradation effects resulting from the present invention's combined effects fatigue testing. Reliability concerns with respect to wide bandgap SiC-based semiconductor devices are exacerbated by the need for these devices to operate at high temperature and high power. Thus, the performance of SiC switching devices is limited by the electrical and materials integrity and reliability of their ohmic contacts. The apparatus and method of the present invention determine the reliability of the contact structure after exposure to combined effects thermal and electrical fatigue.

The present invention for combined thermal and electrical fatigue testing is an apparatus preferably comprising a laser in combination with a timed shutter for raising the temperature of a semiconductor under test to between 300° C. and 1000° C. over a pulse duration of three seconds. Using the pulse-forming electrical circuit of the present invention, a series of about ten pulses is applied to the semiconductor undergoing testing, each pulse followed by a cooling period of about sixty seconds in ambient air. Pre- and post-testing performance parameters are measured, e.g., current, voltage and contact resistance, in the semiconductor undergoing testing. Temperature is measured by a thermocouple or pyrometer. The pre- and post-testing measurements are compared to yield an indication of long-term reliability, e.g., the presence of short circuits and voids.

The present invention is a novel combined effects "thermal and electrical" apparatus and method which serves to determine a window of reliability for individual SiC device components, namely ohmic contact structures or complete device structures. It is an improvement over prior art static testing methods in which pre- and post-testing measurements are compared for a semiconductor under test that is heated in a vacuum furnace to a temperature of 500° C. for at least 100 hours. The improvement of the present invention derives from the greater accuracy of the resulting measurements because these pre- and post-testing measurements address the performance of a semiconductor device not in a vacuum environment, as in the prior art, but in the actual environment in which the device will be used. Results of testing with the device and method of the present invention can ensure optimum performance and long-term reliability for SiC high power pulsed switching devices. Such devices include Insulated Gate Bipolar Transistors (IGBTs) and MOS Controlled Thyristors (MCTs).

BRIEF DESCRIPTION OF THE DRAWINGS

FIG. 2a illustrates an example of a preferred thermal loading scheme demonstrating one thermal pulse with a 3 second duration at a temperature of 650° C.

DETAILED DESCRIPTION

Apparatus

Figure 1:
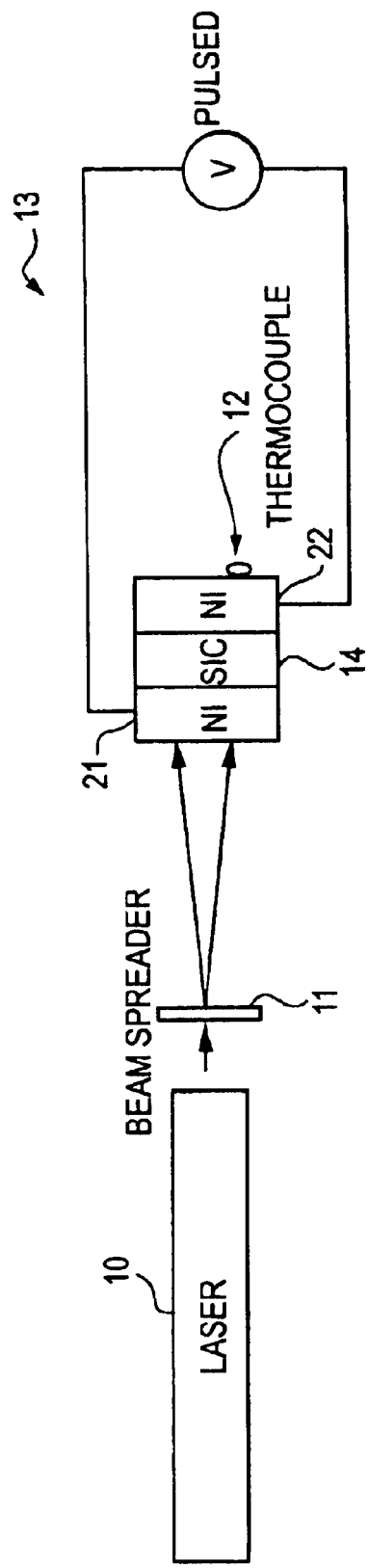
FIG. 1 illustrates a preferred embodiment of the combined thermal and electrical fatigue effects test apparatus of the present invention.

Referring to FIG. 1, a schematic is illustrated of an apparatus for combined thermal and electrical fatigue effects testing, according to a preferred embodiment of the present invention. The apparatus shown in FIG. 1 serves to determine a window of reliability for individual SiC device components, namely ohmic contact structures, or complete device structures. Through the use of the device shown in FIG. 1 according to the method of FIG. 4 it is possible to mimic the potential operational thermal and electrical stress regimes of high power switches and high power palpitated switching.

In FIG. 1 a carbon dioxide $CO_2$ (10.1 micron) laser 10 provides the thermal loading source. A ZnSe beam spreader 11 is shown and can be used to spread the laser beam over an area of ~5 mm. The power level of the laser 10 can be tailored to give the desired test temperatures. A pulse forming network (PFN) 13 is connected to the electronic device 14.

In the device illustrated in FIG. 1, a thermocouple 12 or pyrometer is used to accurately measure temperature and a timed shutter (not shown) is used to create a cycle of heating-cooling events. That is, a shutter is employed that is timed to create the desired duration heating and cooling intervals. In this configuration, the shutter can also be set up to repeat the heating-cooling events to create any number of exposure cycles.

Thus, the thermal loading section of a preferred embodiment of a combined effects test apparatus illustrated in FIG. 1, allows complete tuning of temperature, cycle duration, number of cycles and area of exposure such that it is possible to mimic the operational environment of a pulsed power device with reasonable accuracy.

Figure 2B:
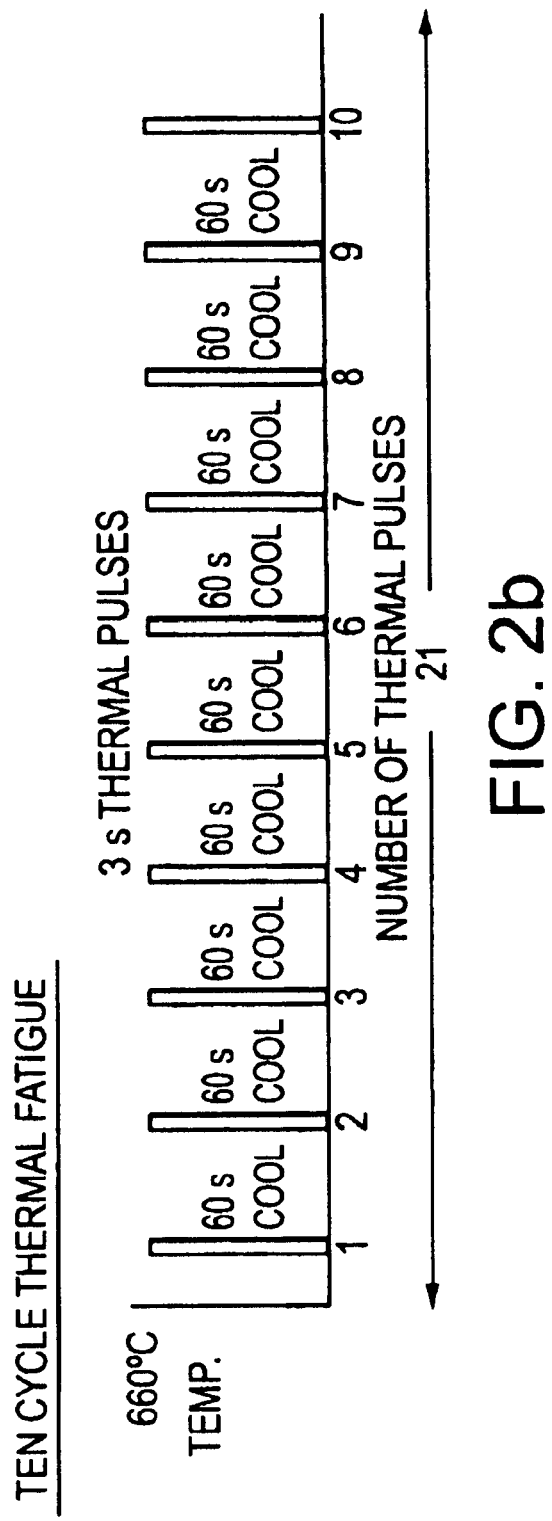
FIG. 2b illustrates a preferred cyclic thermal scheme of 10 consecutive pulses, each with a 3 second duration at a temperature of 650° C. and a cooling interval between pulses of 60 seconds.

FIG. 2a illustrates the operation of the device of FIG. 1 for one cycle 20 of thermal fatigue. FIG. 2b illustrates the operation of the device of FIG. 1 for ten cycles 21 of thermal fatigue.

By way of example only, in a preferred embodiment of a test for a particular electronic device using the apparatus of FIG. 1, a laser positioned 18 inches from the electronic device to result in a spot size on the electronic device of 5 mm and a temperature of 600° C. was achieved using a power level of 40 watts. The thermal and electrical regime imposed in this test is shown in the following table:

| Thermal Parameters | Electrical Parameters |
|---|---|
| Pulse width*: 3 second thermal pulse with 60 second cool | Pulse width*: 400:sec. |
| Rise time: nanosec. | di/dt: 25 kA/:sec. |
| Single pulse or repeated pulses | Single pulse or repeated to 5 shots/min. |
| Temperature*: 300° C. to 1000° C. | Current density ∃ 2.5 $kA/cm^2$ |

*variable parameters

Figure 3:
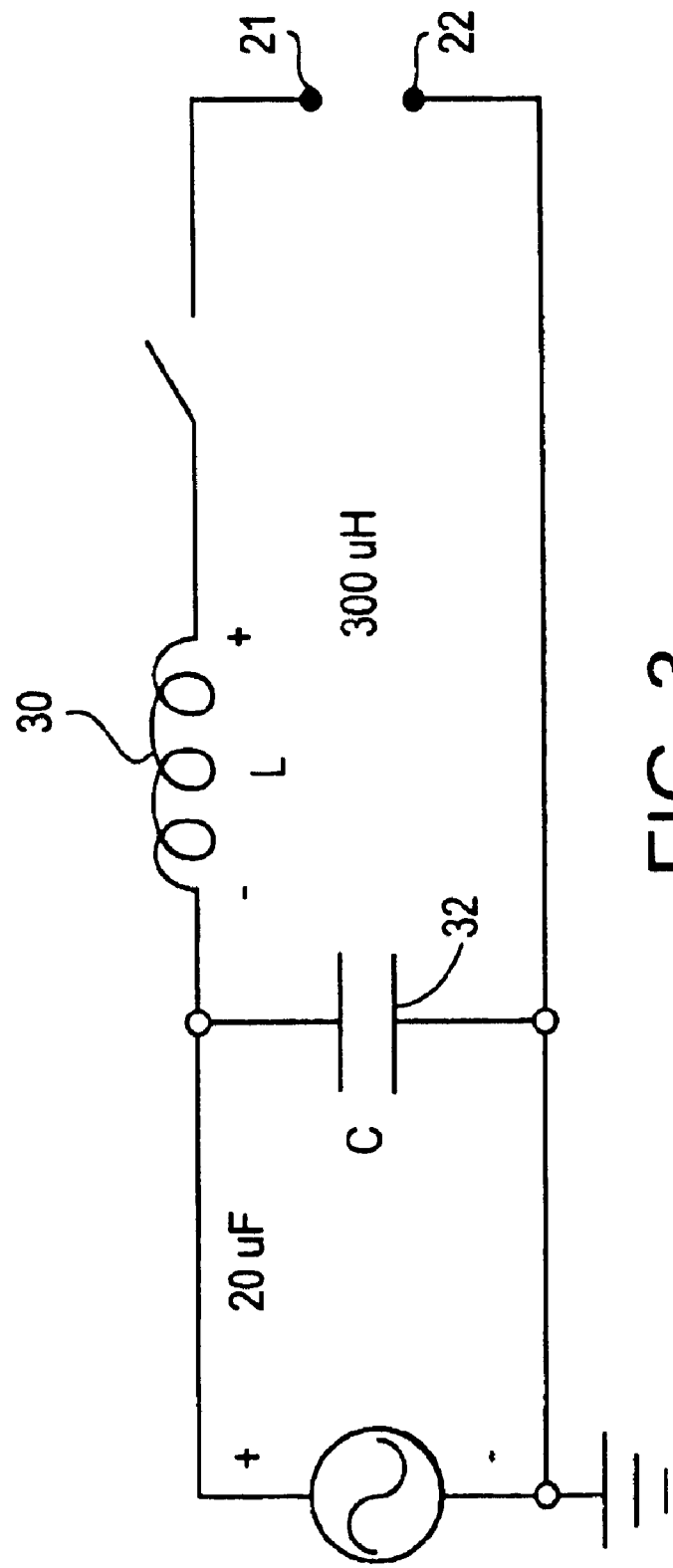
FIG. 3 illustrates a schematic of a preferred embodiment of an electromigration test setup of the present invention.

A preferred embodiment of a pulse-forming network (PFN) for electromigration stress testing, is illustrated in FIG. 3. The PFN comprises an inductor (L) 30 and a capacitor (C) 32 which form an RLC (resistance-inductance-capacitance) network that is used to first store a prescribed amount of electrical energy and then provide a fixed amount of electrical power and energy to the SiC electronic device being tested. Both the amount of electrical energy as well as the method of delivery to the SiC electronic device are tunable and depend on the type of electronic device being tested. In the configuration shown in FIG. 3, the magnitude and duration of delivery of electrical power to the SiC electronic device under test is a function of the initial capacitor voltage, the discrete values of L and C, the size and resistance characteristics of the SiC, and the repetition rate of charge/discharge cycles.

The PFN of the preferred embodiment illustrated in FIG. 3 provides a flexible design that can accommodate the test conditions needed to approximate the magnitude and pulsed power wave fronts necessary for device operation that are relevant to palpitated high power switching architectures.

Method

Figure 4:
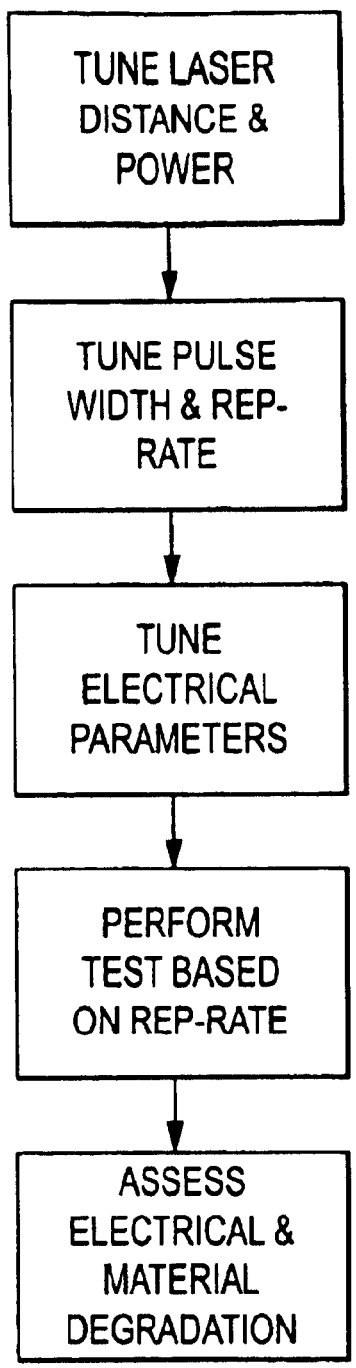
FIG. 4 illustrates a process flow chart of a preferred embodiment of the method of the present invention.

A process flow for an acute cyclical electrical-thermal test method applying the test apparatus of FIGS. 1 and 3 to an electronic device, is illustrated in FIG. 4. The steps of this method are:

Taking pre-testing electrical and materials measurements (structural, microstructural, and chemical);

Mounting an electronic device to be tested on an insulated holder;

Providing test application requirements;

Determining the distance from the laser to the electronic device from the size of the area to irradiated, the target temperature, and the power capabilities of the laser;

Positioning the electronic device the determined distance from the laser;

Tailoring the thermal and electrical parameters to the provided test application requirements:

| Thermal Parameters | Electrical Parameters |
|---|---|
| pulse width | pulse width |
| rise time | di/dt |
| single or repeated | shots/min. |
| temperature | current density |

Constructing a pulse forming network having the tailored thermal and electrical parameters;

Applying the constructed PFN to the mounted electronic device;

Taking post-testing electrical and materials measurements; and

Comparing pre- and post-testing electrical and material measurements to assess degradation of the provided electronic device.

The contacts 21 and 22 of the pulse forming network 13 of FIG. 3 are arranged to provide an electrical pulse to the SiC device 14 as shown in FIG. 1.

The embodiments and modifications discussed herein are by way of example only, are not to be construed as limiting in any sense, and various other embodiments and modifications can be made by those skilled in the art without departing from the spirit and scope of the invention. For example, another type of laser as a thermal loading source may be used at a different distance from the electronic device depending on the desired temperature and power capabilities of the laser.

We claim:

1. An apparatus for assessing the reliability of an electronic device, said apparatus comprising:

a tunable thermal loading means for providing a cyclic thermal load to an electronic device and being tunable for at least one of temperature, rise time, thermal loading cycle, thermal loading duration, and area of thermal exposure; and a tunable electrical loading means for providing a cyclic electrical load to electronic device and being tunable for at least one of current density, rise time, electrical loading cycle, and electrical loading duration;

means for measuring at least one of current, voltage and temperature of the electrode device to assess the long-term reliability of the electronic device; wherein said tunable thermal loading means creates from a thermal source a sequence of at least one cyclic thermal load comprising an ordered pair of a heating event followed by a cooling event, and wherein said tunable electrical loading means comprises a pulse forming network that creates a sequence of at least on cyclic electrical load.

2. The apparatus of claim 1, wherein said tunable thermal loading means comprises a laser to provide a laser beam as said thermal source; and said pulse forming network comprises a resistance-inductance-capacitance network that tunes the cyclic electrical load.

3. The apparatus of claim 2, wherein said laser is positioned at a given distance from the electronic device in order to tune the temperature of the cyclic thermal load provided to the electronic device.

4. The apparatus of claim 2, wherein:

said pulse forming network creates a sequence of no more than 5 of said least one cyclic electrical load per minute, each said at least one cyclic electrical load having a current density of at least 2.5 kA/cm$^2$, a duration of 400 seconds and a rise time of 25 kA/second.

5. The apparatus of claim 2, wherein:

said laser comprises a carbon dioxide $CO_2$ (10.1 micron) laser.

6. A method for assessing the reliability of an electronic device, said method comprising the steps of:

tuning a cyclic electrical load and a cyclic thermal load to mimic the operation of an electronic device;

providing a combination of the tuned cyclic thermal load and tuned cyclic electrical load to the electronic device; and assessing the effects of the provided combination of tuned cyclic thermal load and tuned cyclic electrical load on the reliability of the electrical device, wherein the tuning step comprises creating from a thermal source the tuned cyclic thermal load as a sequence of at least one cyclic thermal load of an ordered pair of a heating event followed by a cooling event and wherein the tuning step further comprises creating from an electrical source by a pulse forming network the tuned cyclic electrical load.

* * * * *